(12) United States Patent
Hemingway et al.

(10) Patent No.: US 10,777,986 B2
(45) Date of Patent: Sep. 15, 2020

(54) OUTDOOR ELECTRICAL BOX CORD AND METHOD OF MAKING AN OUTDOOR ELECTRICAL BOX CORD

(71) Applicant: The Wiremold Company, West Hartford, CT (US)

(72) Inventors: Jeffrey Hemingway, Burlington, CT (US); Richard R. Picard, West Hartford, CT (US); Steven C. Thibault, Harwinton, CT (US)

(73) Assignee: THE WIREMOLD COMPANY, West Hartford, CT (US)

( * ) Notice: Subject to any disclaimer, the term of this patent is extended or adjusted under 35 U.S.C. 154(b) by 156 days.

(21) Appl. No.: 16/030,092

(22) Filed: Jul. 9, 2018

(65) Prior Publication Data
US 2018/0316168 A1 Nov. 1, 2018

Related U.S. Application Data

(63) Continuation-in-part of application No. 15/592,337, filed on May 11, 2017, now Pat. No. 10,020,645, which is a continuation of application No. 15/240,299, filed on Aug. 18, 2016, now Pat. No. 9,653,897, which is a continuation-in-part of
(Continued)

(51) Int. Cl.
| | |
|---|---|
| *H01R 11/11* | (2006.01) |
| *H01R 4/00* | (2006.01) |
| *H01R 4/72* | (2006.01) |
| *H02G 3/18* | (2006.01) |
| *H05K 5/02* | (2006.01) |
| *H02G 3/08* | (2006.01) |
| *H02G 3/14* | (2006.01) |
| *H02G 3/16* | (2006.01) |

(52) U.S. Cl.
CPC .............. *H02G 3/185* (2013.01); *H02G 3/081* (2013.01); *H02G 3/14* (2013.01); *H02G 3/16* (2013.01); *H05K 5/0221* (2013.01); *H05K 5/0226* (2013.01)

(58) Field of Classification Search
CPC ............ H02G 3/16; H02G 3/185; H02G 3/14; H02G 3/081; H05K 5/0221; H05K 5/0226; H01R 11/12
See application file for complete search history.

(56) References Cited

U.S. PATENT DOCUMENTS

| | | | | |
|---|---|---|---|---|
| 4,437,084 A | * | 3/1984 | Clayton, Jr. ............. | G01K 7/22 338/22 R |
| 4,991,288 A | * | 2/1991 | Scholz ................... | H01R 4/723 29/447 |

(Continued)

*Primary Examiner* — Dimary S Lopez Cruz
(74) *Attorney, Agent, or Firm* — McCormick, Paulding & Huber PLLC

(57) ABSTRACT

A power cord includes at least one electrically insulated wire, including a wire conductor disposed within an insulated sleeve, and a connection terminal. The connection terminal includes a crimp portion crimped and soldered to the wire conductor at at least one end of the at least one insulated wire. The power cord further includes a heat shrink sleeve covering the crimp portion of the connection terminal and a portion of the insulated sleeve of the at least one electrically insulated wire, and an overmold molded around at least a portion of the heat shrink sleeve.

18 Claims, 6 Drawing Sheets

Related U.S. Application Data application No. 14/593,441, filed on Jan. 9, 2015, now Pat. No. 9,653,900.

(60) Provisional application No. 62/084,102, filed on Nov. 25, 2014.

(56) References Cited

U.S. PATENT DOCUMENTS

| | | | | |
|---|---|---|---|---|
| 4,993,149 | A * | 2/1991 | Zilligen | B29C 61/0608 |
| | | | | 156/86 |
| 5,137,478 | A * | 8/1992 | Graf | H01R 4/723 |
| | | | | 174/84 R |
| 5,875,547 | A * | 3/1999 | Larsson | H01R 4/70 |
| | | | | 29/869 |
| 6,666,732 | B1 * | 12/2003 | Endacott | H01R 4/187 |
| | | | | 439/730 |
| 9,601,889 | B2 * | 3/2017 | Ito | H01R 4/023 |
| 2014/0251681 | A1 * | 9/2014 | Adachi | B29C 63/42 |
| | | | | 174/72 A |
| 2014/0318862 | A1 * | 10/2014 | Tachi | H01R 43/005 |
| | | | | 174/75 R |
| 2015/0047900 | A1 * | 2/2015 | Suetani | H02G 15/046 |
| | | | | 174/77 R |

* cited by examiner

US 10,777,986 B2

OUTDOOR ELECTRICAL BOX CORD AND METHOD OF MAKING AN OUTDOOR ELECTRICAL BOX CORD

CROSS-REFERENCE TO RELATED APPLICATIONS

This application is a continuation-in-part of U.S. application Ser. No. 15/592,337, filed May 11, 2017, now U.S. Pat. No. 10,020,645, which is a continuation of U.S. application Ser. No. 15/240,299, filed on Aug. 18, 2016, now U.S. Pat. No. 9,653,897, which is a continuation-in-part of U.S. application Ser. No. 14/593,441, filed on Jan. 9, 2015, now U.S. Pat. No. 9,653,900, which claims the benefit of U.S. Provisional Patent Application No. 62/084,102, filed Nov. 25, 2014, each of which is hereby incorporated by reference in its entirety.

FIELD OF THE PRESENT DISCLOSURE

The present disclosure relates to outdoor power distribution and, more particularly, to a cord for use in an electrical box that can be located outdoors in the ground.

BACKGROUND OF THE PRESENT DISCLOSURE

Known outdoor electrical boxes for providing electrical connection points for outdoor power access include wall-mounted receptacles and post-mounted receptacles that may be mounted on vertical surfaces, and electrical boxes mounted in the ground or other horizontal outdoor surface for providing electrical connection points distant from existing walls. For example, in an athletic field, a large public flower garden, or a public park, it may be desirable to provide electrical receptacles for intermittent electrical connections, such as short-term lighting, power washers, and electric maintenance equipment, e.g., hedge trimmers and chain saws. The electrical connection points must be accessible so that a user can plug and unplug devices as required.

Moisture is a significant problem for outdoor electrical boxes because it may lead to electrical box failure and/or may result in a serious electrocution risk. Moisture is particularly problematic for electrical boxes installed in the ground because water may collect and pool therein. Therefore, when electrical power fed into an outdoor electrical box from a power source, for example through a power line buried underground, the power line is led into a NEMA Type 6 enclosure, which is designed to be impenetrable to water during occasional submersions in water. NEMA stands for National Electrical Manufacturer's Association. From the NEMA Type 6 enclosure, power may then be routed to electrical connection points, such as receptacles, within the electrical box, where the electrical box is typically designed in such a way to keep water from reaching the faces of the electrical receptacles and/or the electrical connection points.

However, even though the NEMA Type 6 enclosure is designed to be impenetrable to water, if the enclosure is left submerged for an extended period of time, air may be able to slowly escape the enclosure through the cord or cords that exit the enclosure and connect to the electrical connection points, thereby allowing the NEMA Type 6 enclosure to fill with water.

BRIEF SUMMARY OF THE PRESENT DISCLOSURE

According to the present disclosure, a power cord may comprise at least one electrically insulated wire, including a wire conductor disposed within an insulated sleeve, and a connection terminal. The connection terminal includes a crimp portion crimped and soldered to the wire conductor at at least one end of the at least one insulated wire. The power cord further comprises a heat shrink sleeve covering the crimp portion of the connection terminal and a portion of the insulated sleeve of the at least one electrically insulated wire, and an overmold molded around at least a portion of the heat shrink sleeve.

According to the present disclosure, a method for forming a power cord including at least one electrically insulated wire comprising a wire conductor disposed within an insulated sleeve is disclosed. The method includes crimping a connection terminal on the wire conductor at one end of the at least one electrically insulated wire and soldering the crimped portion of the connection terminal. The method further comprises heat shrinking a heat shrink sleeve onto the crimped portion and at least a portion of the insulated sleeve of the at least one electrically insulated wire, and molding an overmold tube around at least a portion of the heat shrink sleeve.

According to the present disclosure, a power cord for an outdoor electrical box may comprise three electrically insulated wires. Each electrically insulated wire may comprise a wire conductor disposed within an insulated sleeve and a connection terminal including a crimp portion crimped and soldered to the wire conductor at a first end of the power cord. Each electrically insulated wire may further comprise a heat shrink sleeve covering the crimp portion and a portion of the insulated sleeve, and an overmold tube molded around at least a portion of the heat shrink sleeve.

These and other objects, features and advantages of the present disclosure will become apparent in light of the detailed description of embodiments thereof, as illustrated in the accompanying drawings.

DETAILED DESCRIPTION OF THE DRAWINGS

Figure 1:
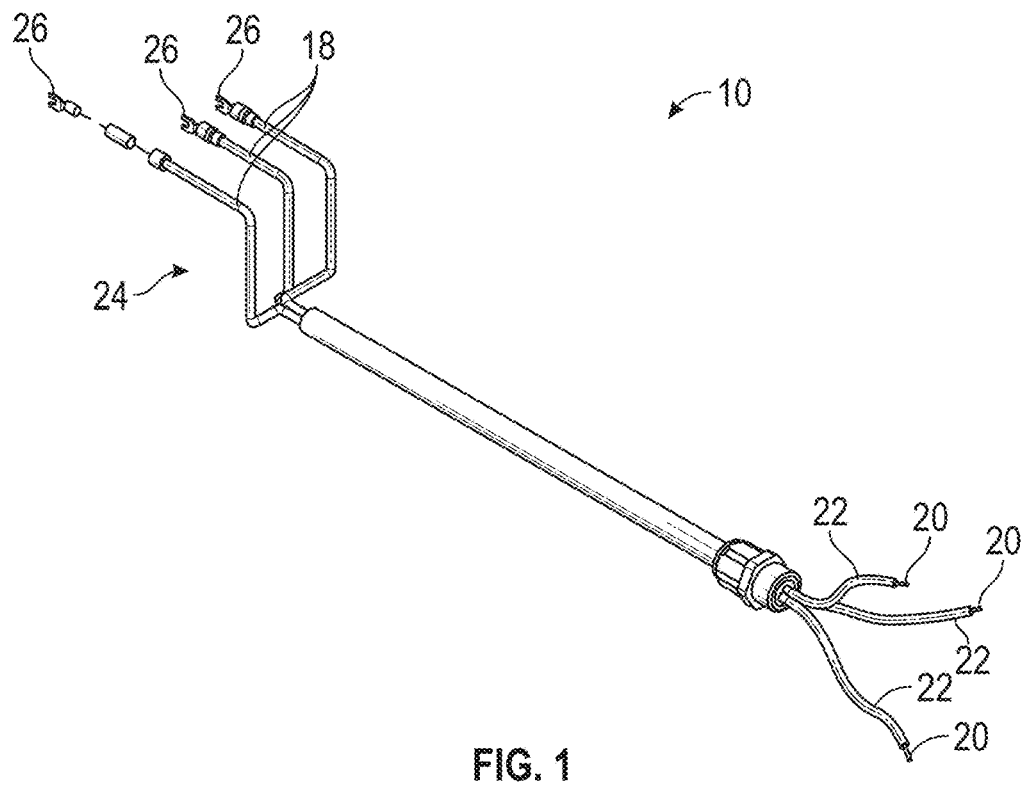
FIG. 1 shows a perspective view of an electrical cord according to the present disclosure.

Before the various embodiments are described in further detail, it is to be understood that the invention is not limited to the particular embodiments described. It is also to be understood that the terminology used is for the purpose of describing particular embodiments only, and is not intended to limit the scope of the claims of the present application.

In the drawings, although certain descriptions may refer only to certain figures and reference numerals, it should be understood that such descriptions might be equally applicable to like reference numerals in other figures. Additionally, although various features have been shown in different figures for simplicity, it should be readily apparent to one of skill in the art that the various features may be combined without departing from the scope of the present disclosure.

Figure 2:
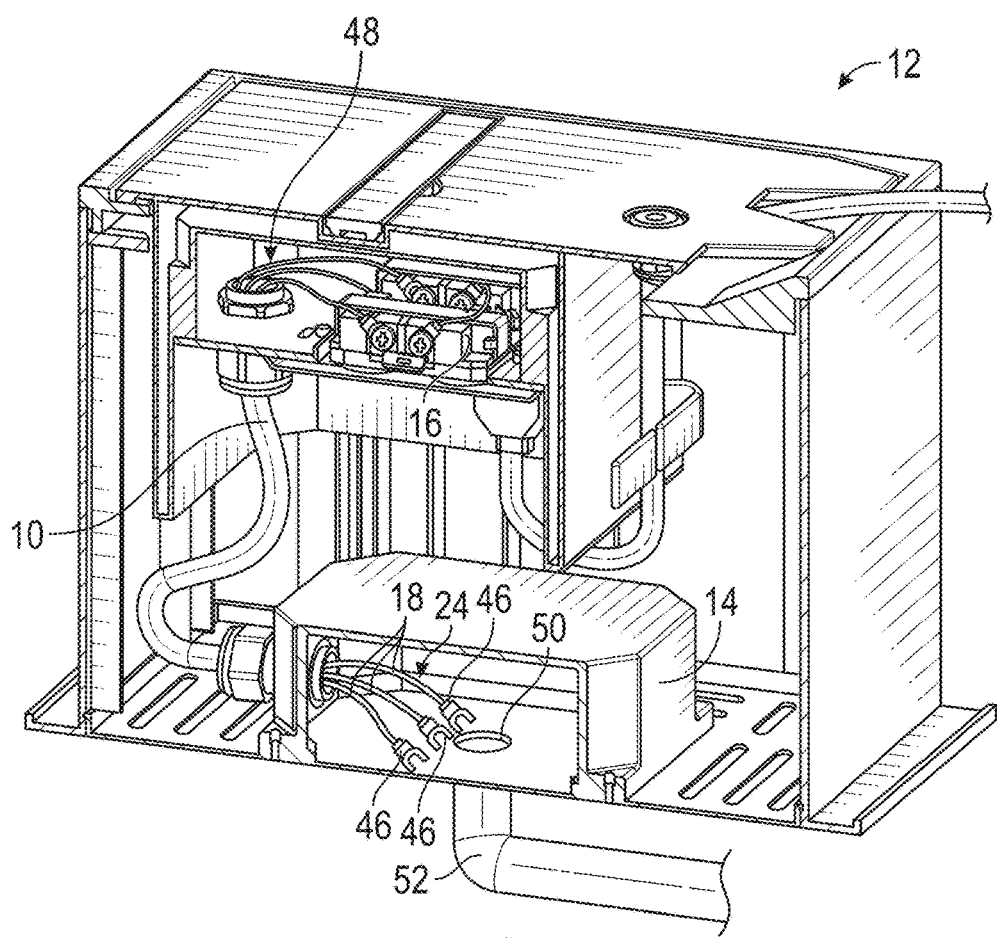
FIG. 2 shows a perspective cut-away view of an electrical box including the electrical cord of FIG. 1.

FIG. 1 shows an electrical cord 10 according to the present disclosure. As seen in FIG. 2, the electrical cord 10 may be used in an electrical box 12 for connecting a NEMA Type 6 enclosure 14, which is designed to be impenetrable to water during occasional submersions in water, to a receptacle 16 or other similar electrical connection point.

The electrical box 12 may be an outdoor electrical box for installation outdoors in the ground such as that described in U.S. application Ser. No. 15/592,337, which is hereby incorporated by reference in its entirety. Thus, the electrical box 12 may allow for easy access to the electrical receptacle 16 while protecting the electrical receptacle 16 from water by keeping water away from the electrical connections and receptacle 16, even while the electrical box 12 is not completely waterproof and may, itself, fill with water.

Referring back to FIG. 1, the electrical cord 10 includes at least one electrically insulated wire 18 comprising a wire conductor 20 disposed within an insulated sleeve 22. For example, the electrical cord 10 may include three electrically insulated wires 18 configured to provide standard positive, negative, and ground wiring connections. At at least a first end 24 of the electrical cord 10 connecting to the NEMA Type 6 enclosure 14, shown in FIG. 2, each electrically insulated wire 18 includes a fork terminal 26 attached thereto according to the method shown in FIGS. 3A-3I to form an airtight and watertight connection.

Figure 3A:
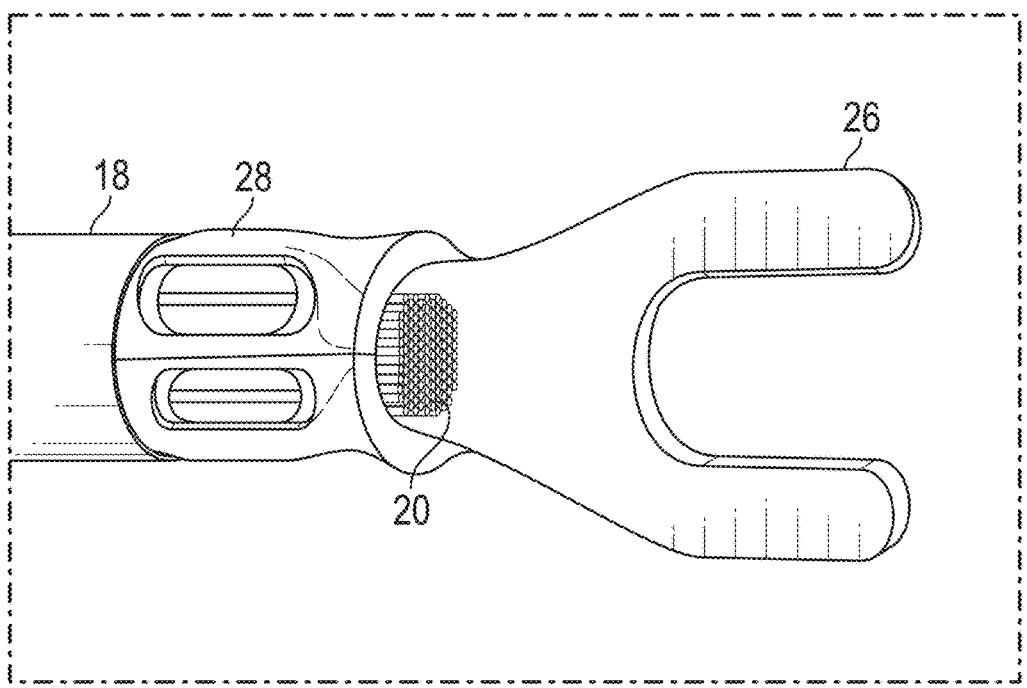
FIGS. 3A-3I show a method for forming the electrical cord of FIG. 1.
Figure 3B:
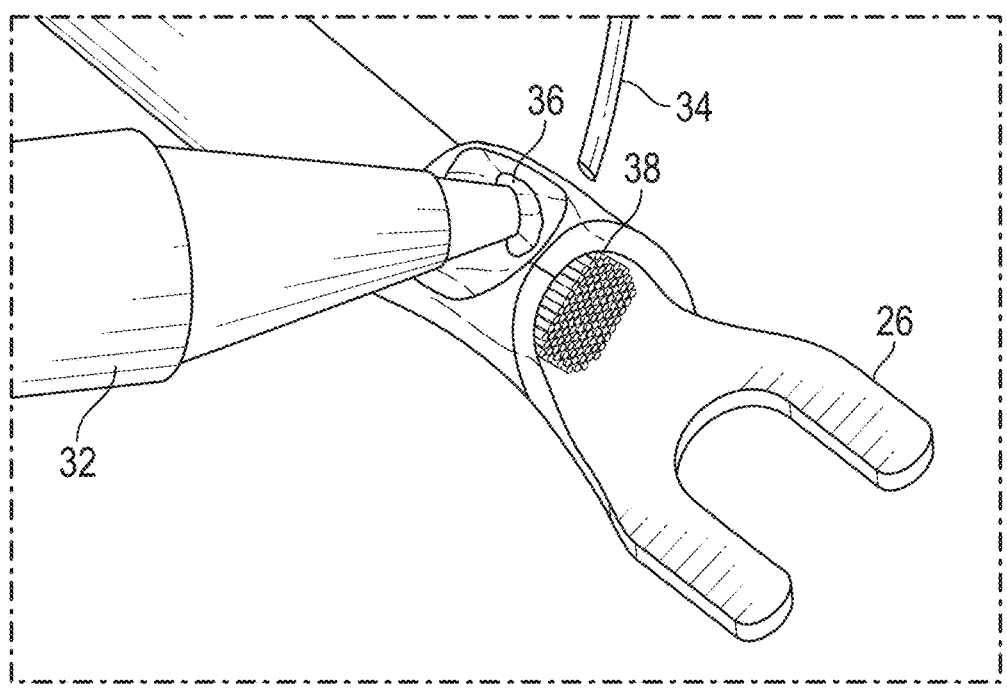
Figure 3C:
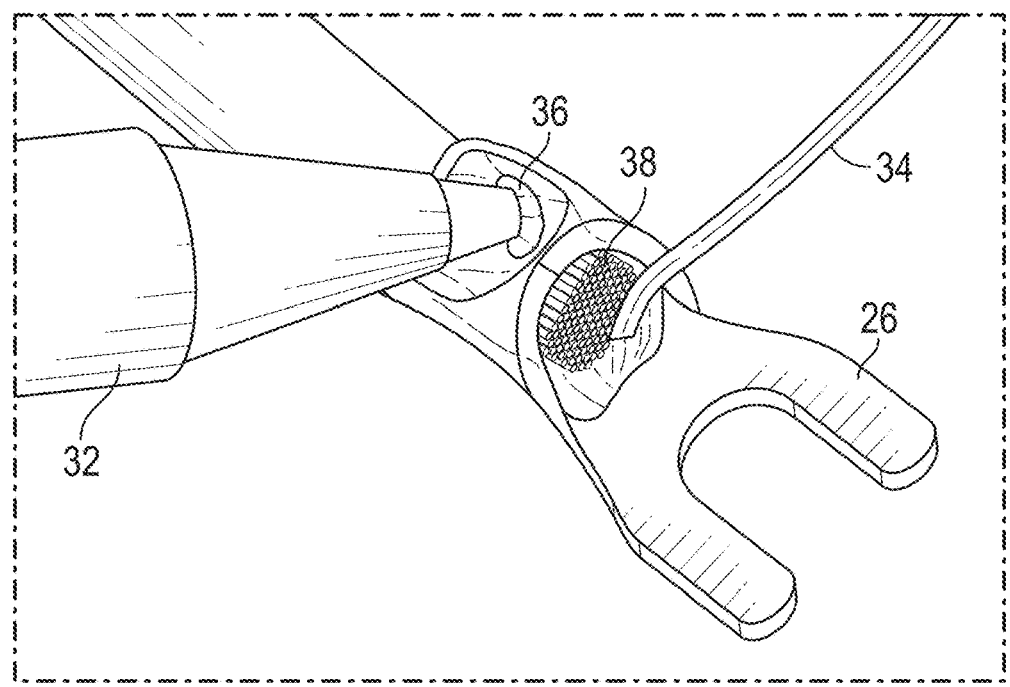
Figure 3D:
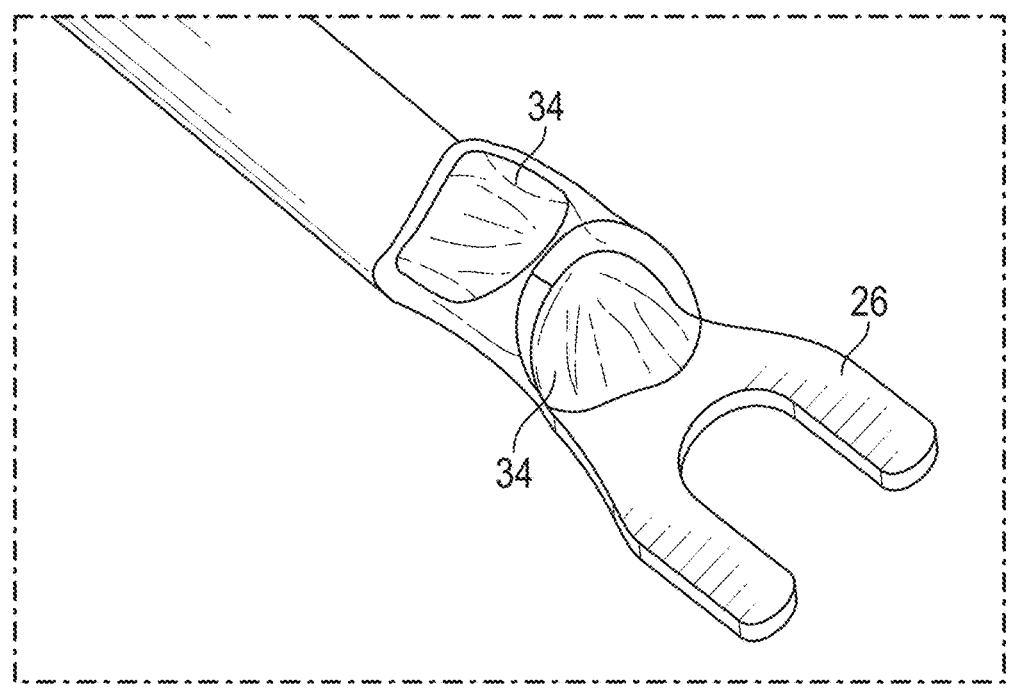

Referring to FIG. 3A, the fork terminal 26 is first connected to the electrically insulated wire 18 by crimping a crimp portion 28 of the fork terminal 26 to conductor 20 of the insulated wire 18. Referring to FIGS. 3B and 3C, heat is then applied to the fork terminal 26 using a soldering iron 32 and solder 34 is applied to top 36 and cavity 38 of the fork terminal 26, as seen in FIGS. 3B and 3C respectively, until the cavity 38 is full, as seen in FIG. 3D. The soldered fork terminal 26 shown in FIG. 3D may then be cleaned to remove any contaminants that could compromise the additional seals formed in the steps shown in FIGS. 3E-3I.

Figure 3E:
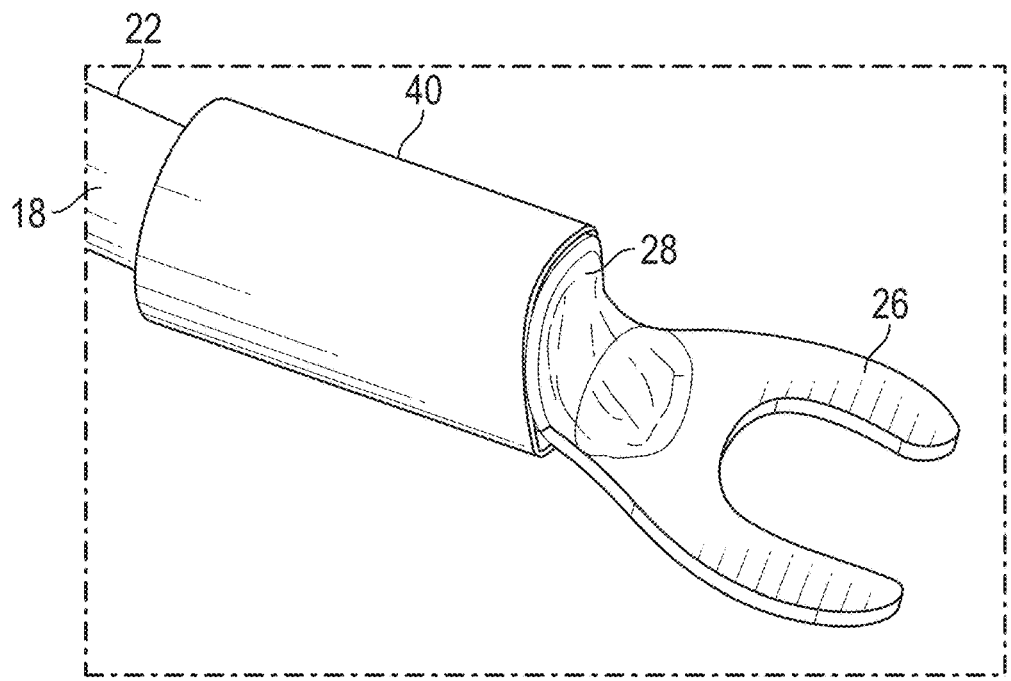
Figure 3F:
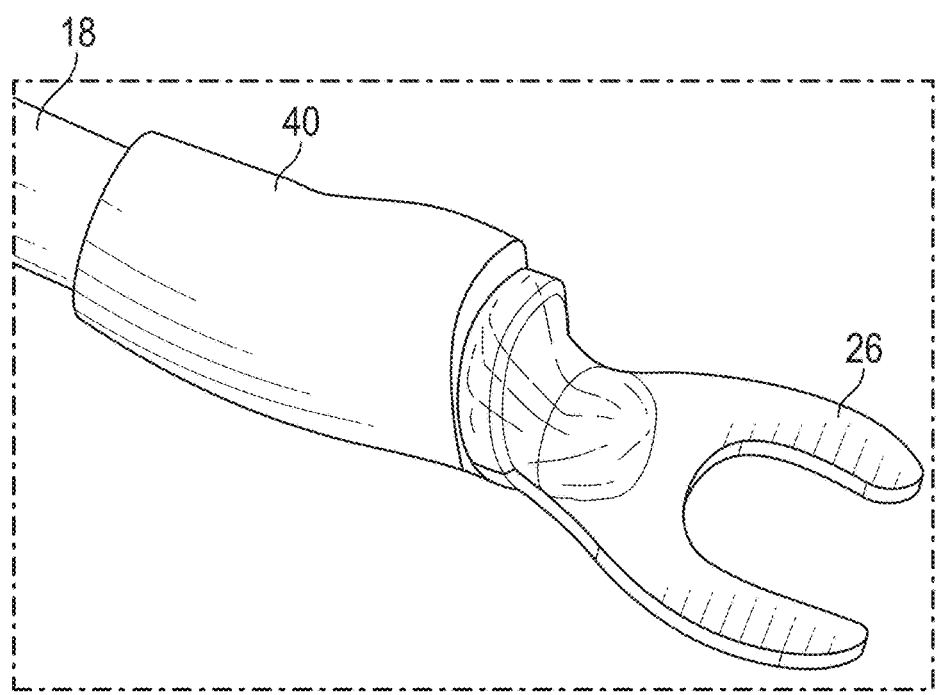

Referring to FIG. 3E, a heat shrink sleeve 40 is then positioned over the crimp portion 28 of the fork terminal 26, with the heat shrink sleeve extending from the crimp portion 28 to also cover a portion of the insulated sleeve 22 of the electrically insulated wire 18. Once the heat shrink sleeve 40 is in position, heat is applied to the sleeve 40 to shrink the sleeve 40 onto the crimp portion 28 and the insulated sleeve 22. Immediately after, pressure may be applied to the sleeve 40 to set the heat shrink, for example, by pressing a contact element along the length of the sleeve 40. The pressure may be applied at multiple locations around the circumference of the sleeve 40, for example, at 90° intervals, by successively rotating and pressing the electrically insulated wire 18 and fork terminal 26 with the sleeve 40 disposed thereon. FIG. 3F shows the insulated wire 18 and fork terminal 26 with the heat shrink sleeve 40 after the heat shrink sleeve 40 has been fully applied thereto.

Figure 3G:
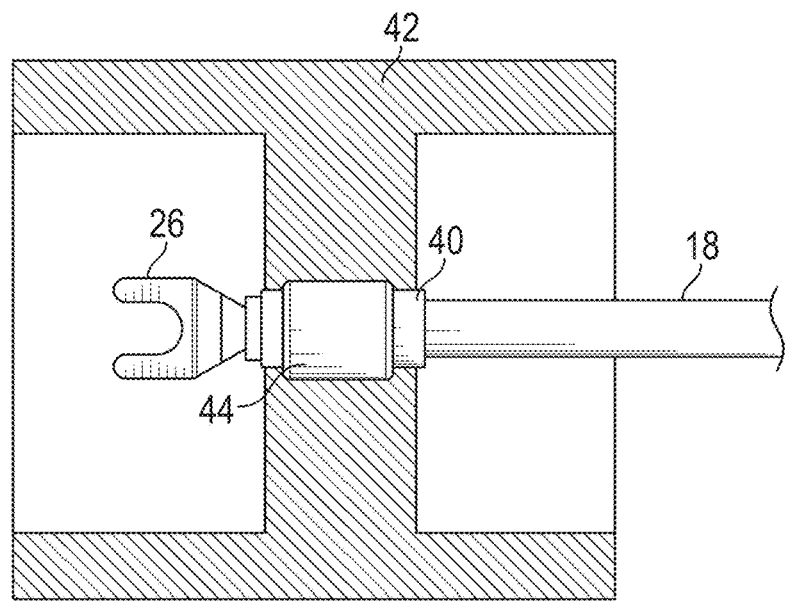
Figure 3H:
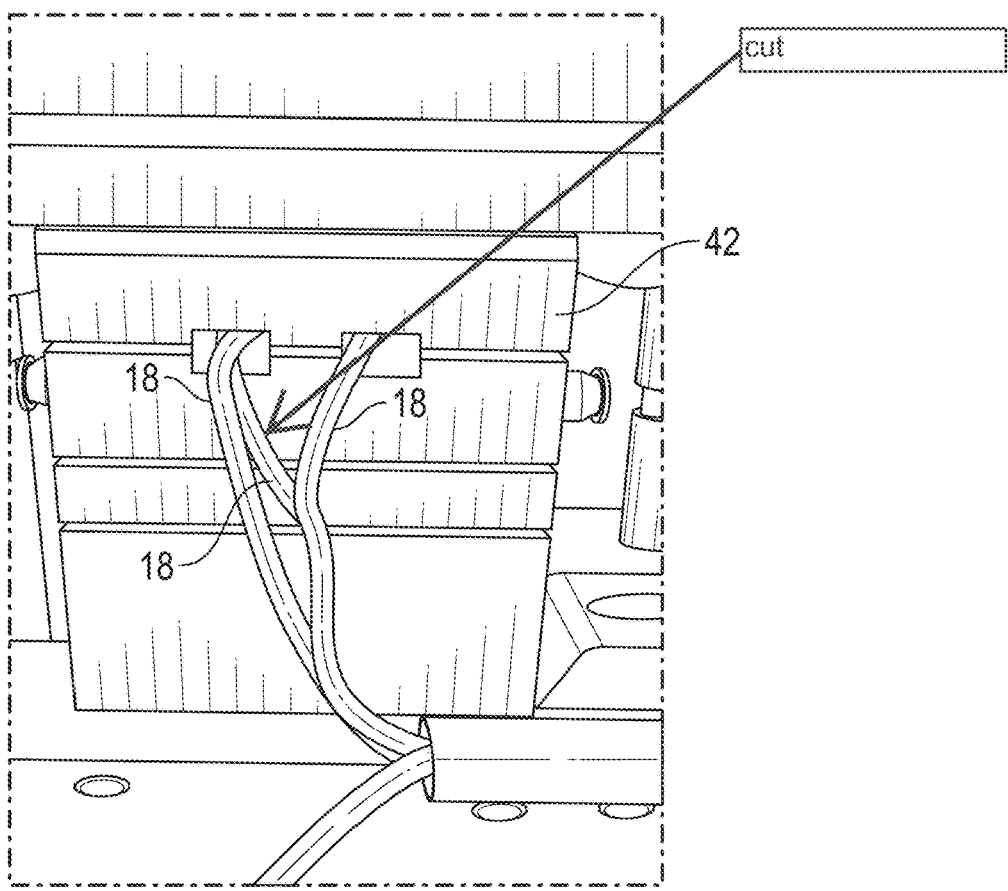
Figure 3I:
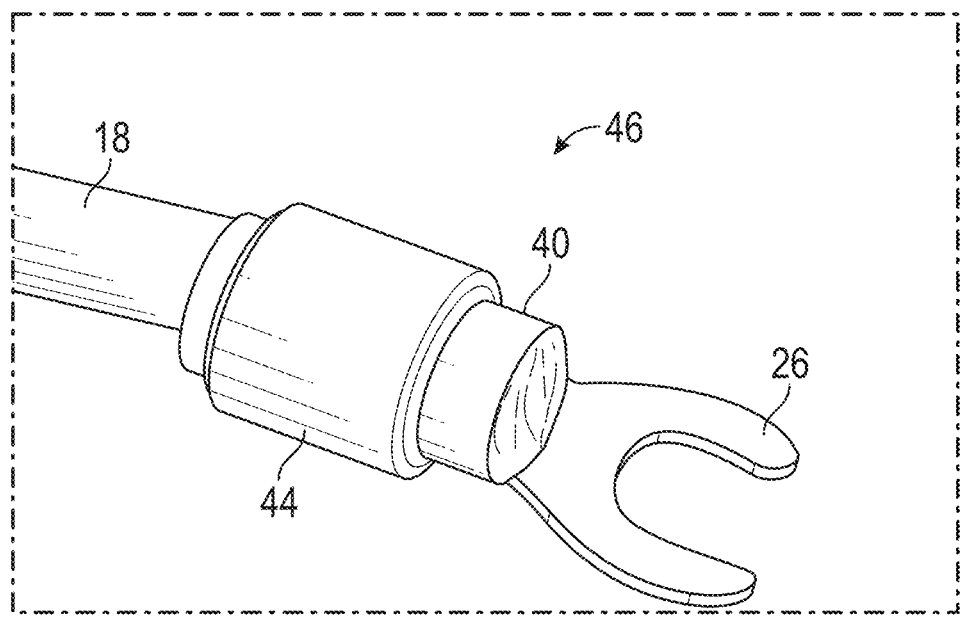

Referring to FIGS. 3G and 3H, the fork terminal 26 and the end of the insulated wire 18 with the heat shrink sleeve 40 applied thereto is then positioned within a mold 42, such as an injection mold or the like. Liquid nylon is then injected into the mold and allowed to harden to form a nylon overmold 44 around the fork terminal, insulated wire 18, and heat shrink sleeve 40, to provide a finished wire terminal 46 as shown in FIG. 3I. As seen, the overmold 44 does not cover need to cover the entire heat shrink sleeve 40 and, in embodiments, the heat shrink sleeve 40 may extend outward from the overmold 44 at one or both ends of the overmold 44.

The overmold 44 provides increased rigidity to the connection between the electrically insulated wire 18 and the fork terminal 26, thereby making a stronger connection. Additionally, without the overmold 44, the heat shrink sleeve 40 at the connection between the electrically insulated wire 18 and the fork terminal 26 could crack or break when flexing. This finished wire terminal 46, which includes a crimped, soldered, heat shrink, and overmolded connection, prevents water from seeping through the electrically insulated wire 18 into the enclosure 14, shown in FIG. 2, and/or prevents air from escaping the enclosure 14 through the electrically insulated wire 18, both of which can result in flooding of the interior of enclosure 14 if the enclosure 14 is submerged when the electrical box 12 is filled or partially filled with water.

As shown in FIG. 2, each electrically insulated wire 18 of the cord 10 includes the finished wire terminal 46 according to the present disclosure at at least the first end 24 of the cord 10 to prevent any flooding of the interior of enclosure 14 during submersion. A second end 48 of the electrical cord 10 may include standard wire connections as shown in FIG. 1 or, alternatively, may have the same airtight and watertight finished wire terminals 46 of the present disclosure described in connection with the first end 24.

As seen in FIG. 2, the enclosure 14 may include an opening 50 connected to a conduit 52, such as a steel or poly-vinyl-chloride conduit, through which power wires from a power mains are routed into the enclosure 14 for connection to the finished wire terminals 46 of the cord 10 according to any conventional manner. For example, the enclosure 14 may house a ground fault circuit interrupter connecting the power wires from the power mains to the electrically insulated wires 18 of the cord 10 in a conventional manner so that electrical power may be disconnected from the receptacle 16 by the ground fault circuit interrupter in a hazardous situation is detected. Because enclosure 14 is water impenetrable and because cord 10 prevents water from seeping through the electrically insulated wires 18 into the enclosure 14 and prevents air from escaping the enclosure 14 through the electrically insulated wire 18, the electrical connection between the power wires from the power mains and the electrically insulated wires 18 of the cord 10 will not be exposed to water even when the electrical box 12 is filled with water and the enclosure 14 is submerged, thus preventing that electrical connection from presenting an electrocution risk.

Although the electrical cord 10 according to the present disclosure has been described in connection with an outdoor electrical box for installation in the ground for exemplary purposes, the electrical cord 10 may be suitable for any other similar application where preventing leakage is desirable.

As will be recognized by those of ordinary skill in the pertinent art, numerous changes and modifications may be made to the above-described embodiments of the present disclosure without departing from the spirit of the invention as defined in the appended claims. Accordingly, the particular embodiments described in this specification are to be taken as merely illustrative and not limiting.

What is claimed is:

1. A power cord comprising:
   at least one electrically insulated wire comprising a wire conductor disposed within an insulated sleeve, the wire conductor extending outward from the insulated sleeve at at least one end of the insulated wire;
   a connection terminal, the connection terminal including
   a crimp portion crimped and soldered to the wire conductor at the at least one end of the at least one insulated wire;
   a heat shrink sleeve covering the crimp portion of the connection terminal and a portion of the insulated sleeve of the at least one electrically insulated wire; and
   an overmold molded around at least a portion of the heat shrink sleeve;

wherein the heat shrink sleeve extends outward past both ends of the overmold in a longitudinal direction of the at least one electrically insulated wire.

2. The power cord according to claim 1, wherein the at least one electrically insulated wire comprises three electrically insulated wires.

3. The power cord according to claim 1, wherein the connection terminal includes a fork terminal.

4. The power cord according to claim 1, wherein the overmold is nylon.

5. The power cord according to claim 1, wherein the wire conductor extends outward from the insulated sleeve at a second end of the insulated wire;
wherein a second connection terminal including a second crimp portion is crimped and soldered to the wire conductor at the second end of the at least one insulated wire;
wherein a second heat shrink sleeve covers the second crimp portion of the second connection terminal and a second portion of the insulated sleeve of the at least one electrically insulated wire; and
wherein a second overmold is molded around at least a portion of the second heat shrink sleeve.

6. A method for forming a power cord including at least one electrically insulated wire comprising a wire conductor disposed within an insulated sleeve, the method comprising:
crimping a connection terminal on the wire conductor at one end of the at least one electrically insulated wire;
soldering the crimped portion of the connection terminal;
heat shrinking a heat shrink sleeve onto the crimped portion of the connection terminal and at least a portion of the insulated sleeve of the at least one electrically insulated wire; and
molding an overmold tube around at least a portion of the heat shrink sleeve, with the heat shrink sleeve extending outward past both ends of the overmold in a longitudinal direction of the at least one electrically insulated wire.

7. The method according to claim 6, wherein soldering the crimped portion of the connection terminal includes filling a cavity of the crimped portion in which the wire conductor is disposed.

8. The method according to claim 7, wherein soldering the crimped portion of the connection terminal additionally includes soldering a top of the crimped portion.

9. The method according to claim 6, additionally comprising:
cleaning the soldered crimped portion after soldering the crimped portion to the connection terminal.

10. The method according to claim 6, wherein heat shrinking the heat shrink sleeve onto the crimped portion and the at least a portion of the insulated sleeve includes applying pressure to the heat shrink sleeve to set the heat shrink sleeve.

11. The method according to claim 10, further comprising:
successively applying pressure at multiple locations around a circumference of the heat shrink sleeve.

12. The method according to claim 6, wherein the overmold tube is formed from nylon.

13. A power cord for an outdoor electrical box, the power cord comprising:
three electrically insulated wires, each electrically insulated wire comprising:
a wire conductor disposed within an insulated sleeve;
a connection terminal including a crimp portion crimped and soldered to the wire conductor at a first end of the power cord;
a heat shrink sleeve covering the crimp portion of the connection terminal and a portion of the insulated sleeve of the electrically insulated wire; and
an overmold tube molded around at least a portion of the heat shrink sleeve;
wherein the heat shrink sleeve of each electrically insulated wire extends outward past both ends of the overmold tube in a longitudinal direction of the electrically insulated wire.

14. The power cord according to claim 13, wherein the connection terminal of each electrically insulated wire includes a fork terminal.

15. The power cord according to claim 13, wherein each overmold tube is nylon.

16. The power cord according to claim 13, wherein at a second end of the power cord, each electrically insulated wire comprises:
a second connection terminal including a second crimp portion crimped and soldered to the wire conductor at the second end of the power cord;
a second heat shrink sleeve covering the second crimp portion of the second connection terminal and a second portion of the insulated sleeve of the electrically insulated wire; and
a second overmold tube molded around at least a portion of the second heat shrink sleeve.

17. The power cord according to claim 16, wherein each second connection terminal of each electrically insulated wire includes a fork terminal.

18. The power cord according to claim 16, wherein each second heat shrink sleeve of each electrically insulated wire extends outward past both ends of the second overmold tube in the longitudinal direction of the electrically insulated wire.

* * * * *